United States Patent
Xu et al.

(10) Patent No.: US 11,121,677 B1
(45) Date of Patent: Sep. 14, 2021

(54) TRANSCONDUCTANCE AMPLIFIER BASED ON SELF-BIASED CASCODE STRUCTURE

(71) Applicant: CHINA ELECTRONIC TECHNOLOGY CORPORATION, 24TH RESEARCH INSTITUTE, Chongqing (CN)

(72) Inventors: Daiguo Xu, Chongqing (CN); Gangyi Hu, Chongqing (CN); Ruzhang Li, Chongqing (CN); Jian'an Wang, Chongqing (CN); Guangbing Chen, Chongqing (CN); Yuxin Wang, Chongqing (CN); Tao Liu, Chongqing (CN); Lu Liu, Chongqing (CN); Minming Deng, Chongqing (CN); Hanfu Shi, Chongqing (CN); Xu Wang, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 433 days.

(21) Appl. No.: 16/625,671

(22) PCT Filed: Jan. 26, 2016

(86) PCT No.: PCT/CN2016/072178
§ 371 (c)(1),
(2) Date: Dec. 20, 2019

(87) PCT Pub. No.: WO2017/124576
PCT Pub. Date: Jul. 27, 2017

(30) Foreign Application Priority Data

Jan. 21, 2016 (CN) .......................... 201610040317.7

(51) Int. Cl.
*H03F 3/45* (2006.01)
*H03F 1/22* (2006.01)

(52) U.S. Cl.
CPC .................................. *H03F 1/223* (2013.01)

(58) Field of Classification Search
CPC ........................................................ H03F 3/45
(Continued)

(56) References Cited

U.S. PATENT DOCUMENTS

| 7,514,966 B2 * | 4/2009 | Ho | ....................... H03K 5/2481 327/53 |
| 7,786,801 B2 * | 8/2010 | Kim | .................... H03F 3/45219 330/255 |

(Continued)

FOREIGN PATENT DOCUMENTS

| CN | 101064497 A | 10/2007 |
| CN | 103199807 A | 7/2013 |
| CN | 105141265 A | 12/2015 |

*Primary Examiner* — Henry Choe
(74) *Attorney, Agent, or Firm* — Cheng-Ju Chiang

(57) ABSTRACT

Provided in the present invention is a transconductance amplifier based on a self-biased cascode structure. The transconductance amplifier includes a self-biased cascode input-stage structure constituted by PMOS (P-channel Metal Oxide Semiconductor) input transistors M1, M2, M3 and M4, a self-biased cascode first-stage load structure constituted by NMOS (N-channel Metal Oxide Semiconductor) transistors M5, M6, M7 and M8, a second-stage common-source amplifier structure constituted by an NMOS transistor M9 and a PMOS transistor M10, a bias circuit structure constituted by NMOS transistors M11 and M12 and a PMOS transistor M13, an amplifier compensation capacitor $C_c$, an amplifier load capacitor $C_L$, a reference current source Iref and a PMOS transistor M0 that provides a constant current source function. Further provided in the present invention is a transconductance amplifier based on a self-biased cascode
(Continued)

structure, which adopts an NMOS transistor as an input transistor. Both input transistors and load transistors of a first-stage amplifier of the present invention adopt self-biased cascode structures, such that the output impedance and the DC gain of the first-stage amplifier are increased. Substrate voltages of the MOS transistors of the first-stage amplifier are provided by an amplifier bias circuit. Owing to a connection mode of the compensation capacitor $C_c$, a higher figure of merit is achieved.

6 Claims, 8 Drawing Sheets

(58) Field of Classification Search
USPC .......................................... 330/253, 257, 261
See application file for complete search history.

(56) References Cited

U.S. PATENT DOCUMENTS

| | | |
|---|---|---|
| 2009/0160557 A1 | 6/2009 | Luzzi et al. |
| 2011/0063030 A1 | 3/2011 | Jang et al. |
| 2011/0215849 A1* | 9/2011 | Wadhwa ............... H03L 7/0896 |
| | | 327/157 |

* cited by examiner

TRANSCONDUCTANCE AMPLIFIER BASED ON SELF-BIASED CASCODE STRUCTURE

TECHNICAL FIELD

The present invention belongs to the field of analog or digital-analog hybrid integrated circuit technology, and particularly relates to a transconductance amplifier based on a self-biased cascode structure.

BACKGROUND

In recent years, with constant development of the integrated circuit manufacturing technology, the demand for a low-power-consumption analog integrated circuit has gradually increased. A supply voltage has been further reduced in order to meet the demand for a low power consumption. In response, to guarantee the working performance of an amplifier, some structures for increasing a gain of a transconductance amplifier have been developed, and a self-biased cascode structure is one of them. Under this structure, a threshold voltage of an MOS (Metal Oxide Semiconductor) transistor is changed by adjusting a substrate voltage thereof, such that the transconductance and the output impedance of the MOS transistor are changed. In this way, the transconductance amplifier can obtain a higher gain than that of a conventional structure. Under a traditional structure, methods used for changing the threshold voltage of the MOS transistor include using a low-threshold transistor or supplying an additional bias voltage for the MOS transistor, but this will increase the process or circuit design complexity. On the other hand, a conventional compensation method has difficulties in increasing the unity-gain bandwidth while the amplifier achieves a high gain. Therefore, it is difficult for several conventional structures to satisfy the requirements of the high-performance transconductance amplifier.

In order to describe the above technical problems in more detail, working principles, advantages and disadvantages of two transconductance amplifiers adopting traditional structures are analyzed in the present application. Referring to a structure 1 shown in FIG. 1 which is a schematic diagram of a conventional two-stage transconductance amplifier. Since the advantages of excellent matching attribute, low noise and the like are achieved when a PMOS (P-channel Metal Oxide Semiconductor) transistor is used as an input transistor, the PMOS transistor is typically used as the input transistor of the transconductance amplifier on non-high-speed low-noise application occasions. In the structure 1, input signals VIP and VIN are input from gates of PMOS input transistors M1 and M2. The PMOS input transistors M1 and M2 and NMOS (N-channel metal oxide semiconductor) transistor M3 and M4 all work in a saturation region, such that a first-stage amplifier can provide a relatively high DC gain. A second-stage common source amplifier is constituted by an NMOS transistor M5 and a PMOS transistor M6. Owing to this structure, a relatively large output swing can be provided while a certain grain is kept. A capacitor $C_c$ and a resistor $R_c$ constitute an RC compensation structure, such that the amplifier can obtain a certain unity-gain bandwidth while being kept stable. Under the structure shown in FIG. 1, the gain of the amplifier meets the following formula:

$$\text{Gain}_{[1]} = g_{m1,2} \cdot (r_{o2} \| r_{o4}) \cdot g_{m5} \cdot (r_{o5} \| r_{o6}) \quad (1)$$

The structure shown in FIG. 1 has the advantage of a simple circuit structure. However, after study, the Inventor of the present application found that since RC compensation is employed, high compensation resistance RC is required to obtain a low-frequency left half plane zero. At the same time, the resistance of a resistor is poor in consistency under a standard process. As a result, it is difficult to obtain a relatively fixed left half plane zero.

Referring to a structure 2 shown in FIG. 2, which is a schematic diagram of a self-biased cascode transconductance amplifier. In the structure 2, PMOS input transistors M1, M2, M3 and M4 constitute a self-biased cascode input-stage structure. At the same time, PMOS transistors M0, M8, M9 and M10 constitute a constant-current-source structure. This structure is characterized in that threshold voltages of the PMOS input transistors M3 and M4 and the PMOS transistors M8 and M10 are changed by specially setting substrate voltages thereof, such that the output impedance is increased. The working principle of this structure will be analyzed below. By taking an input-stage PMOS transistor in FIG. 2 as an example, channel widths of the PMOS input transistors M1 and M3 are designed to be the same as a channel width of the PMOS input transistor M1 in FIG. 1, and the sum of channel lengths of the PMOS input transistors M1 and M3 are designed to be the same as a channel length of the PMOS input transistor M1 in FIG. 1. In this way, the input transistor M1 in FIG. 1 and the input transistors M1 and M3 in FIG. 2 occupy the same area. In the structure shown in FIG. 2, the sizes of other MOS transistors with the self-biased cascode structures, such as PMOS transistors M2, M4, M8 and M9, adopt the same design method. By the above-mentioned method, the threshold voltages of the PMOS input transistors M3 and M4 are lower than those of M1 and M2. Under a certain input voltage VIN/VIP, a side circuit is analyzed:

$$VIN + |Vthp3| V_{S3} < VIN + |Vthp1| \quad (2)$$

Vthp3 and Vthp1 are threshold voltages of the PMOS input transistors M3 and M1, and $V_{s3}$ is a source voltage of the PMOS input transistor M3. If the threshold voltages and an input voltage are appropriately set to meet the formula (2), both of the PMOS input transistors M1 and M3 can work in the saturation region.

Output impedance of the self-biased cascode structure is analyzed below when the formula (2) is met. A small-signal equivalent circuit diagram is as shown in FIG. 3. A node KCL equation is formulated as below:

$$\frac{V - Vx}{r_{o3}} + g_{m3} \cdot (\Delta Vin - \Delta Vx) = \frac{Vx}{r_{o1}} + g_{m1} \cdot \Delta Vin = I \quad (3)$$

The foregoing equation is solved to obtain:

$$Req = g_{m3} \cdot r_{o1} \cdot r_{o3} + r_{o1} + r_{o3} \approx g_{m3} \cdot r_{o1} \cdot r_{o3} \quad (4)$$

Therefore, gain of the structure shown in FIG. 2 meets the following formula:

$$\text{Gain}_{[2]} = g_{m1,2} \cdot ((g_{m3} \cdot r_{o3} \cdot r_{o1}) \| r_{o5}) \cdot g_{m7} \cdot ((g_{m8} \cdot r_{o8} \cdot r_{o9}) \| r_{o7}) \quad (5)$$

It can be known from formula (5) that the DC gain of the amplifier shown in FIG. 2 is increased to some extent with respect to that of the amplifier shown in FIG. 1. However, after study, the Inventor of the present application found that the circuit structure shown in FIG. 2 needs special use of a low-threshold transistor or provision of a bias voltage VCM, which will increase the process or circuit complexity. On the other hand, the amplifier structure shown in FIG. 2 still adopts the RC compensation method with a limited compensation effect.

SUMMARY

In order to solve the technical problems in the prior art, the present invention provides a transconductance amplifier based on a self-biased cascode structure. A DC gain of the amplifier is further increased without increasing the process or circuit complexity. At the same time, a larger unity-gain bandwidth can be obtained. Thus, a higher figure of merit is achieved. Further, the problems of a traditional structure can be effectively solved.

In order to fulfill this objective, the present invention adopts the following technical solution.

A transconductance amplifier based on a self-biased cascode structure includes a self-biased cascode input-stage structure constituted by PMOS (P-channel Metal Oxide Semiconductor) input transistors M1, M2, M3 and M4, a self-biased cascode first-stage load structure constituted by NMOS (N-channel Metal Oxide Semiconductor) transistors M5, M6, M7 and M8, a second-stage common-source amplifier structure constituted by an NMOS transistor M9 and a PMOS transistor M10, a bias circuit structure constituted by NMOS transistors M11 and M12 and a PMOS transistor M13, an amplifier compensation capacitor $C_c$, an amplifier load capacitor $C_L$, a reference current source Iref and a PMOS transistor M0 that provides a constant current source function.

Sources of the PMOS input transistors M1 and M2 are connected to a drain of the PMOS transistor M0. Gates of the PMOS input transistors M1 and M3 are connected to an input signal VIN. Gates of the PMOS input transistors M2 and M4 are connected to an input signal VIP. A drain of the PMOS input transistor M1 is connected to a source of the PMOS input transistor M3. A drain of the PMOS input transistor M2 is connected to a source of the PMOS input transistor M4. Substrates of the PMOS input transistors M3 and M4 are connected to a bias voltage Vp. The bias voltage Vp is provided by a gate voltage of the PMOS transistor M13 of which a gate and a drain are connected in an amplifier bias circuit.

A gate and a drain of the NMOS transistor M5 are both connected to gates of the NMOS transistors M6, M7 and M8 and a drain of the PMOS input transistor M3. A drain of the NMOS transistor M6 is connected to a drain of the PMOS input transistor M4. A source of the NMOS transistor M5 is connected to a drain of the NMOS transistor M7. A source of the NMOS transistor M6 is connected to a drain of the NMOS transistor M8. Sources of the NMOS transistors M7 and M8 are grounded. Substrates of the NMOS transistors M5 and M6 are connected to a bias voltage Vn. The bias voltage Vn is provided by a gate voltage of the NMOS transistor M11 of which a gate and a drain are connected in the amplifier bias circuit.

Sources of the PMOS transistors M10, M0 and M13 are connected to a supply voltage vdd. A gate of the PMOS transistor M10 is connected to gates of the PMOS transistors M0 and M13. A drain of the PMOS transistor M10, one end of the compensation capacitor $C_c$, a drain of the NMOS transistor M9 and one end of the load capacitor $C_L$ are connected to form a connection node. The connection node is an output end Vout of the transconductance amplifier. The other end of the compensation capacitor $C_c$ is connected to a drain of the PMOS input transistor M2. The other end of the load capacitor $C_L$ and a source of the NMOS transistor M9 are grounded. A gate of the NMOS transistor M9 is connected to a drain of the PMOS input transistor M4.

A drain of the PMOS transistor M13 is connected to a drain of the NMOS transistor M12. A gate of the NMOS transistor M12 is connected to one end of the reference current source Iref and a gate and a drain of the NMOS transistor M11. Sources of the NMOS transistors M11 and M12 are grounded. The other end of the reference current source Iref is connected to the supply voltage vdd.

According to the transconductance amplifier based on the self-biased cascode structure, provided in the present invention, both the input transistors and the load transistors of the first-stage amplifier adopt self-biased cascode structures. In comparison with a traditional structure, the output impedance and the DC gain of the first-stage amplifier are increased obviously. The substrate voltages of the PMOS input transistors M3 and M4 and the NMOS transistors M5 and M6 of the first-stage amplifier are provided by the amplifier bias circuit without adding a bias voltage. In addition, owing to the connection mode of the compensation capacitor $C_c$, a transmission function of the amplifier will generate one left half plane zero which can be utilized to compensate for a first non-dominant pole of the transmission function. Thus, a unity-gain bandwidth of the amplifier is greatly increased while a relatively large phase margin is kept. Further, a higher figure of merit is achieved.

Further, a ratio of a channel length of the PMOS input transistor M1 to a channel length of the PMOS input transistor M3 is 1:4. A ratio of a channel length of the NMOS transistor M5 to a channel length of the NMOS transistor M7 is 1:4.

Further, the compensation capacitor $C_c$ has the capacitance of 2 pF to 4 pF.

The present invention further discloses a transconductance amplifier based on a self-biased cascode structure, which takes NMOS transistors as input transistors. The transconductance amplifier includes a self-biased cascode input-stage structure constituted by NMOS input transistors M1, M2, M3 and M4, a self-biased cascode first-stage load structure constituted by PMOS transistors M5, M6, M7 and M8, a second-stage common-source amplifier structure constituted by an NMOS transistor M9 and a PMOS transistor M10, a bias circuit structure constituted by NMOS transistors M11 and M12 and a PMOS transistor M13, an amplifier compensation capacitor $C_c$, an amplifier load capacitor $C_L$, a reference current source Iref and a PMOS transistor M0 that provides a constant current source function.

Sources of the NMOS input transistors M1 and M2 are grounded. Gates of the NMOS input transistors M1 and M3 are connected to an input signal VIN. Gates of the NMOS input transistors M2 and M4 are connected to an input signal VIP. A drain of the NMOS input transistor M1 is connected to a source of the NMOS input transistor M3. A drain of the NMOS input transistor M2 is connected to a source of the NMOS input transistor M4. Substrates of the NMOS input transistors M3 and M4 are connected to a bias voltage Vn. The bias voltage Vn is provided by a gate voltage of the NMOS transistor M11 of which a gate and a drain are connected in an amplifier bias circuit.

A gate and a drain of the PMOS transistor M5 are both connected to gates of the PMOS transistors M6, M7 and M8 and a drain of the NMOS input transistor M3. A drain of the PMOS transistor M6 is connected to a drain of the NMOS input transistor M4. A source of the PMOS transistor M5 is connected to a drain of the PMOS transistor M7. A source of the PMOS transistor M6 is connected to a drain of the PMOS transistor M8. Sources of the PMOS transistors M7 and M8 are connected to a drain of the PMOS transistor M0. Substrates of the PMOS transistors M5 and M6 are connected to a bias voltage Vp. The bias voltage Vp is provided by a gate voltage of the PMOS transistor M13 of which a gate and a drain are connected in the amplifier bias circuit.

A source of the PMOS transistor M10 is connected to a supply voltage vdd. A drain of the PMOS transistor M10, one end of the compensation capacitor $C_c$, a drain of the NMOS transistor M9 and one end of the load capacitor $C_L$ are connected to form a connection node. The connection node is an output end Vout of the transconductance amplifier. A gate of the PMOS transistor M10 is connected to a drain of the NMOS input transistor M4. The other end of the compensation capacitor $C_c$ is connected to a drain of the PMOS input transistor M2. The other end of the load capacitor $C_L$ and a source of the NMOS transistor M9 are grounded. A gate of the NMOS transistor M9 is connected to a gate of the NMOS transistor M12.

Sources of the PMOS transistors M0 and M13 are connected to the supply voltage vdd. A gate of the PMOS transistor M0 is connected to a gate and a drain of the PMOS transistor M13. A drain of the PMOS transistor M13 is connected to a drain of the NMOS transistor M12. A gate of the NMOS transistor M12 is connected to one end of the reference current source Iref and a gate and a drain of the NMOS transistor M11. Sources of the NMOS transistors M11 and M12 are grounded. The other end of the reference current source Iref is connected to the supply voltage vdd.

Further, a ratio of a channel length of the NMOS input transistor M1 to a channel length of the NMOS input transistor M3 is 1:4. A ratio of a channel length of the PMOS transistor M5 to a channel length of the PMOS transistor M7 is 1:4.

Further, the compensation capacitor $C_c$ has the capacitance of 2 pF to 4 pF.

DETAILED DESCRIPTION

In order to make technical means, creation features and objective and effect achievements of the present invention easy to understand, the present invention will be further described below with reference to specific figures.

Figure 4:
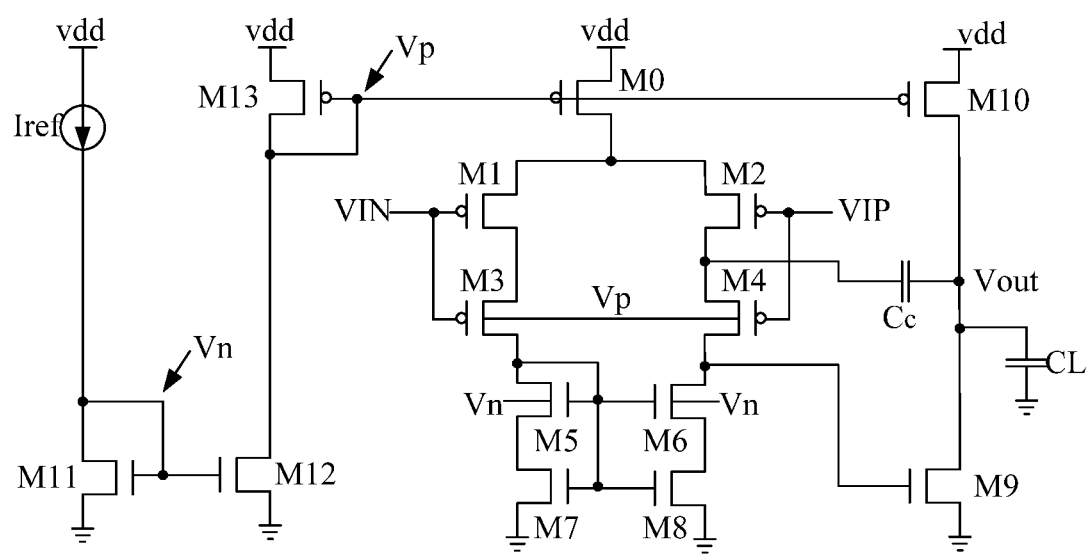
FIG. 4 is a schematic diagram of a transconductance amplifier based on a self-biased cascode structure according to the present invention.

As shown in FIG. 4, provided in the present invention is a transconductance amplifier based on a self-biased cascode structure. The transconductance amplifier includes a self-biased cascode input-stage structure constituted by PMOS input transistors M1, M2, M3 and M4, a self-biased cascode first-stage load structure constituted by NMOS transistors M5, M6, M7 and M8, a second-stage common-source amplifier structure constituted by an NMOS transistor M9 and a PMOS transistor M10, a bias circuit structure constituted by NMOS transistors M11 and M12 and a PMOS transistor M13, an amplifier compensation capacitor $C_c$, an amplifier load capacitor $C_L$, a reference current source Iref and a PMOS transistor M0 that provides a constant current source function.

The PMOS input transistors M1, M2, M3 and M4 constitute the self-biased cascode structure to keep relatively high output impedance and simultaneously to provide relatively high output impedance. The PMOS input transistors M1 and M3 are connected in series. The PMOS input transistors M2 and M4 are connected in series. Sources of the PMOS input transistors M1 and M2 are connected to a drain of the PMOS transistor M0. Gates of the PMOS input transistors M1 and M3 are connected to an input signal VIN. Gates of the PMOS input transistors M2 and M4 are connected to an input signal VIP. A drain of the PMOS input transistor M1 is connected to a source of the PMOS input transistor M3. A drain of the PMOS input transistor M2 is connected to a source of the PMOS input transistor M4. Substrates of the PMOS input transistors M3 and M4 are connected to a bias voltage Vp. The bias voltage Vp is provided by a gate voltage of the PMOS transistor M13 of which a gate and a drain are connected in an amplifier bias circuit.

The NMOS transistors M5, M6, M7 and M8 constitute the self-biased cascode structure to provide high output impedance. The NMOS transistors M5 and M7 are connected in series. The NMOS transistors M6 and M8 are connected in series. A gate and a drain of the NMOS transistor M5 are both connected to gates of the NMOS transistors M6, M7 and M8 and a drain of the PMOS input transistor M3. A drain of the NMOS transistor M6 is connected to a drain of the PMOS input transistor M4. A source of the NMOS transistor M5 is connected to a drain of the NMOS transistor M7. A source of the NMOS transistor M6 is connected to a drain of the NMOS transistor M8. Sources of the NMOS transistors M7 and M8 are grounded. Substrates of the NMOS transistors M5 and M6 are connected to a bias voltage Vn. The bias voltage Vn is provided by a gate voltage of the NMOS transistor M11 of which a gate and a drain are connected in the amplifier bias circuit.

Sources of the PMOS transistors M10, M0 and M13 are connected to a supply voltage vdd. A gate of the PMOS transistor M10 is connected to gates of the PMOS transistors M0 and M13. A drain of the PMOS transistor M10, one end of the compensation capacitor $C_c$, a drain of the NMOS transistor M9 and one end of the load capacitor $C_L$ are connected to form a connection node. The connection node is an output end Vout of the transconductance amplifier. The other end of the compensation capacitor $C_c$ is connected to a drain of the PMOS input transistor M2. The other end of the load capacitor $C_L$ and a source of the NMOS transistor M9 are grounded. A gate of the NMOS transistor M9 is connected to a drain of the PMOS input transistor M4.

A drain of the PMOS transistor M13 is connected to a drain of the NMOS transistor M12. A gate of the NMOS transistor M12 is connected to one end of the reference current source Iref and a gate and a drain of the NMOS transistor M11. Sources of the NMOS transistors M11 and M12 are grounded. The other end of the reference current source Iref is connected to the supply voltage vdd.

According to the transconductance amplifier based on the self-biased cascode structure, provided in the present invention, both the input transistors and the load transistors of a first-stage amplifier adopt self-biased cascode structures. In comparison with a traditional structure, the output impedance and the DC gain of the first-stage amplifier are increased obviously. The substrate voltages of the PMOS input transistors M3 and M4 and the NMOS transistors M5 and M6 of the first-stage amplifier are provided by the amplifier bias circuit without adding a bias voltage. In addition, owing to the connection mode of the compensation capacitor $C_c$, a transmission function of the amplifier will generate one left half plane zero which can be utilized to compensate for a first non-dominant pole of the transmission function. Thus, a unity-gain bandwidth of the amplifier is greatly increased while a relatively large phase margin is kept. Further, a higher figure of merit is achieved.

Figure 1:
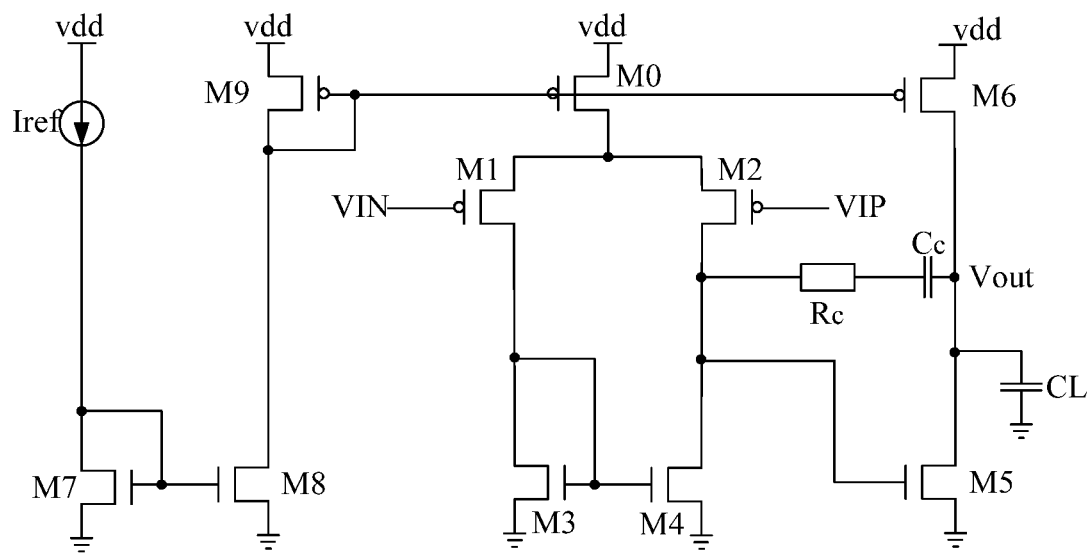
FIG. 1 is a schematic diagram of a traditional two-stage transconductance amplifier.

A side circuit is analyzed blow. Channel widths of the PMOS input transistors M1 and M3 in FIG. 4 are both designed to be the same as a channel width of the PMOS input transistor M1 in FIG. 1. At the same time, the sum of the channel lengths of the PMOS input transistors M1 and M3 in FIG. 4 is designed to be the same as a channel length of the PMOS input transistor M1 in FIG. 1. On the other hand, channel widths of the NMOS transistors M5 and M7 in FIG. 4 are both designed to be the same as a channel width of the NMOS transistor M3 in FIG. 1. The sum of the channel lengths of the NMOS transistors M5 and M7 in FIG. 4 is designed to be the same as a channel length of the NMOS transistor M3 in FIG. 1. In this way, an input transistor M1 and a load transistor M3 in FIG. 1 occupy the same areas as the input transistors M1 and M3 and the load transistors M5 and M7 in FIG. 4. Through analysis on the structure shown in FIG. 2, it can be known that if the channel lengths of the PMOS input transistors M1 and M3 connected in series and the NMOS transistors M5 and M7 connected in series in FIG. 4 are reasonably distributed, the DC gain of the amplifier in FIG. 4 may be represented as:

$$\text{Gain}_{[proposed]} = g_{m1,2} \cdot ((g_{m3} \cdot r_{o1} \cdot r_{o3}) \| (g_{m5} \cdot r_{o5} \cdot r_{o7})) \cdot g_{m9} \cdot (r_{o9} \| r_{o10}) \quad (6)$$

Figure 2:
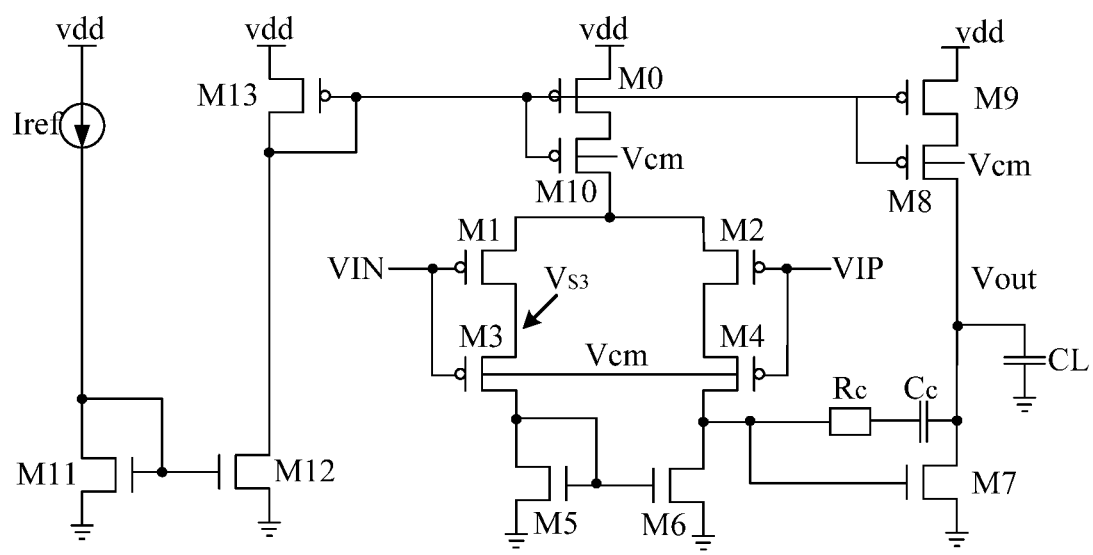
FIG. 2 is a schematic diagram of a traditional self-biased cascode transconductance amplifier.
Figure 3:
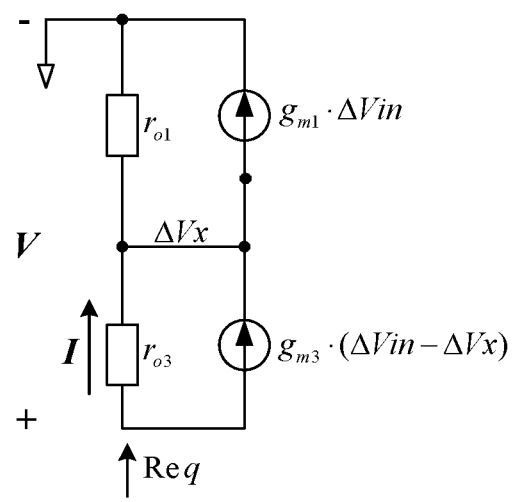
FIG. 3 is a schematic view of a small-signal equivalent circuit of a self-biased cascode structure shown in FIG. 2.

It can be known from formula (6) that the DC gain of the transconductance amplifier based on the self-biased cascode structure in FIG. 4 is obviously larger than that of the structure shown in FIG. 2. As a specific implementation mode that the channel lengths of the PMOS input transistors M1 and M3 connected in series and the NMOS transistors M5 and M7 connected in series in FIG. 4 are reasonably distributed, a ratio of the channel length of the PMOS input transistor M1 to the channel length of the PMOS input transistor M3 is 1:4, and a ratio of the channel length of the NMOS transistor M5 to the channel length of the NMOS transistor M7 is 1:4.

Figure 5:
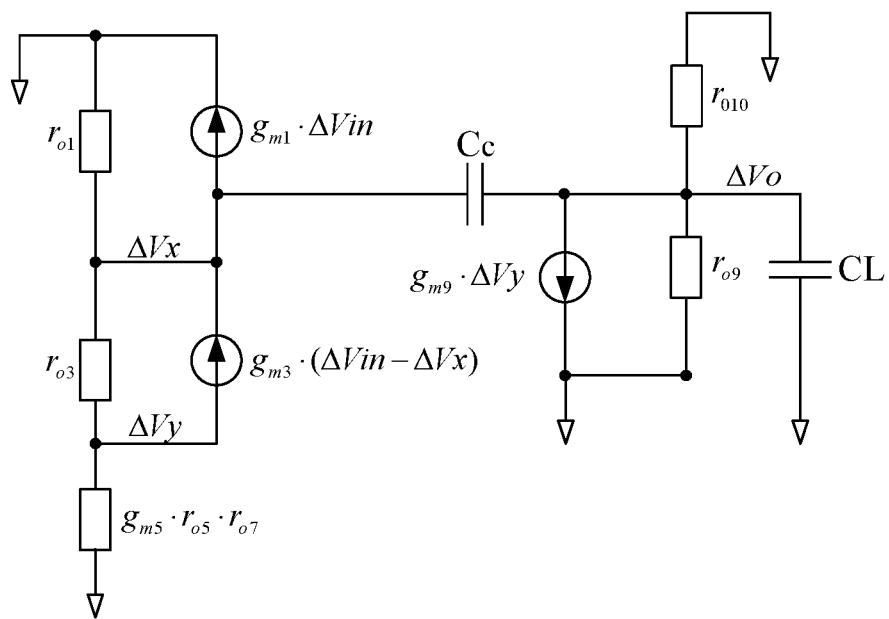
FIG. 5 is a small-signal equivalent circuit of the transconductance amplifier based on the self-biased cascode structure shown in FIG. 4.

A compensation mode of the structure shown in FIG. 4 will be analyzed below, still analyzing the side circuit. FIG. 5 is a schematic diagram of a small-signal equivalent circuit of the structure shown in FIG. 4. A KCL node equation is formulated as below:

$$\begin{cases} \dfrac{\Delta Vx}{r_{o1}} + g_{m1} \cdot \Delta Vin + \dfrac{\Delta Vx - \Delta Vy}{r_{o3}} - \\ g_{m3} \cdot (\Delta Vin - \Delta Vx) + (\Delta Vx - \Delta Vo) \cdot sCc = 0 \\ \dfrac{\Delta Vy - \Delta Vx}{r_{o3}} + \dfrac{\Delta Vy}{g_{m5} \cdot r_{o5} \cdot r_{o7}} + g_{m3} \cdot (\Delta Vin - \Delta Vx) = 0 \\ (\Delta Vo - \Delta Vx) \cdot sCc + \dfrac{\Delta Vo}{r_{o10}} + g_{m9} \cdot \Delta Vy + \dfrac{\Delta Vo}{r_{o9}} + \Delta Vo \cdot sCL = 0 \end{cases} \quad (7)$$

In the equation set (7), $g_{m5} \cdot r_{o5} \cdot r_{o7}$ is small-signal equivalent output impedances of the NMOS transistors M5 and M7 connected in series in FIG. 4. By solving the equation set (7), it can be known that a transmission function of the small-signal equivalent circuit shown in FIG. 5 has one left half plane zero with the following formula:

$$z \approx -k \frac{g_{m3}}{Cc} \quad (8)$$

Figure 6:
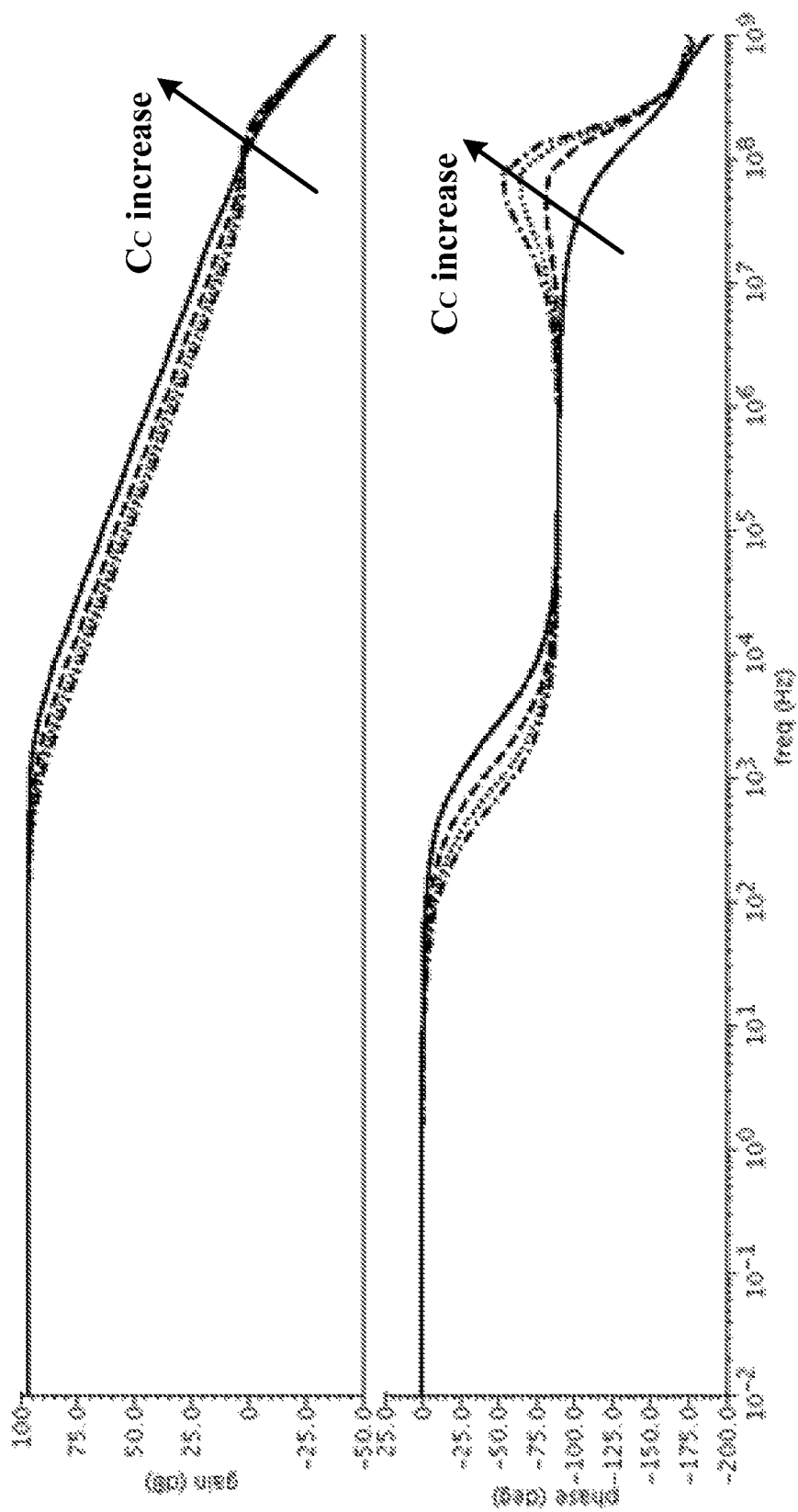
FIG. 6 is a schematic view of a variation trend of AC characteristics of the transconductance amplifier based on the self-biased cascode structure along with a compensation capacitor $C_c$.

In formula (8), k is a constant. It can be known from formula (8) that the transmission function of the circuit structure shown in the present invention has one left half plane zero that will move to a low frequency with increase of the compensation capacitor Cc. The specific variation trend of the left half plane zero is as shown in FIG. 6. It can be seen from FIG. 6 that with increase of the compensation capacitor $C_c$, curves that represent an amplitude-frequency characteristic and a phase-frequency characteristic of the circuit structure shown in the present invention both tilt up. This shows that a simulation result conforms to the foregoing theoretical derivation. Thus, a first non-dominant pole of the transmission function can be compensated by the left half plane zero. Further, the circuit structure shown in the present invention can obtain a larger unity-gain bandwidth.

Figure 7:
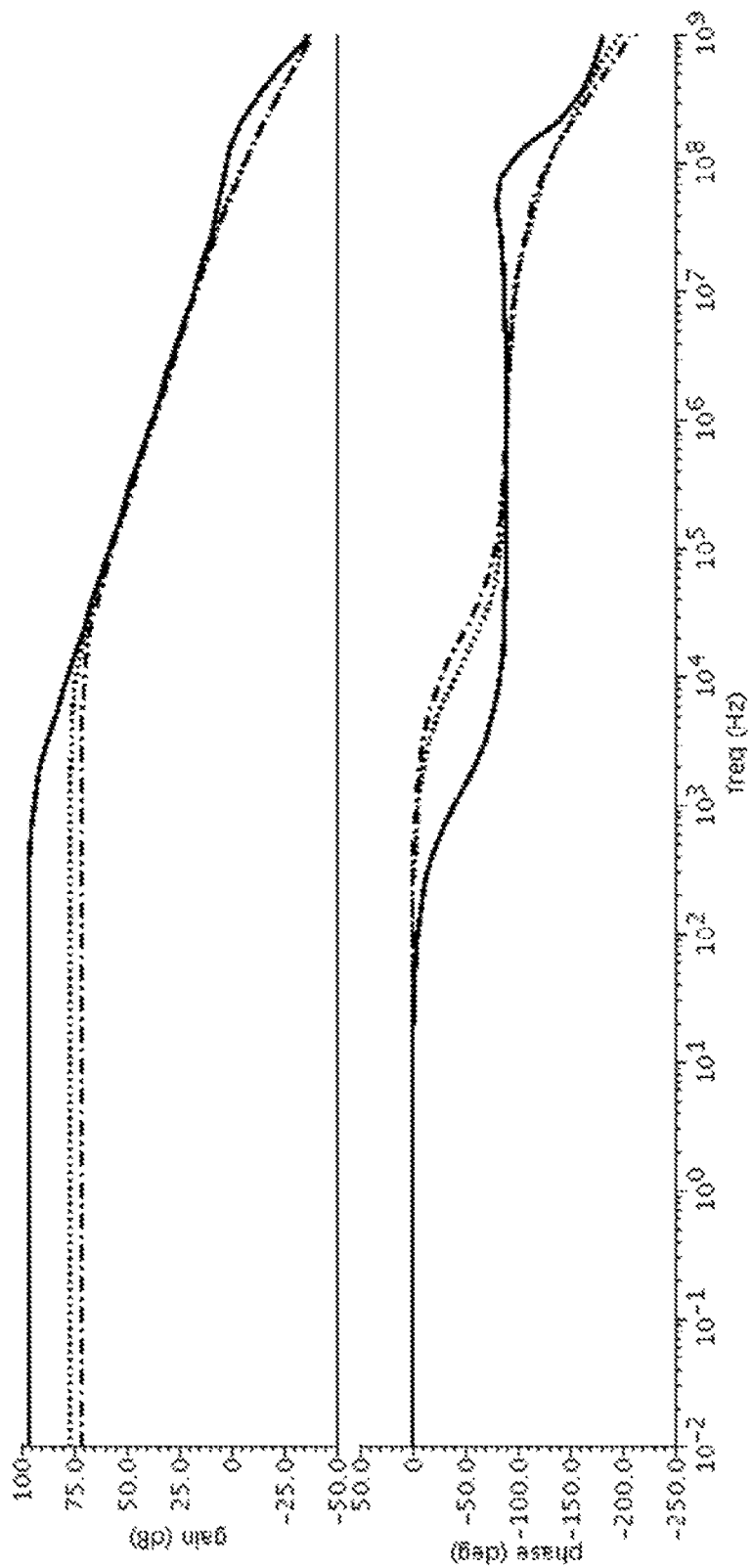
FIG. 7 is a schematic view showing comparison of AC characteristic simulation results of the three structures in FIG. 1, FIG. 2 and FIG. 4.

In order to further verify the above-mentioned advantages of the present invention, the foregoing three structures are carefully designed under a 0.18 μm CMOS (Complementary Metal Oxide Semiconductor) process. In addition, input/output transistors and the load transistors are the same in size. The capacitance of the compensation capacitor $C_c$ is taken as 2 pF, and the capacitance of the load capacitor is taken as 15 pF. At last, a diagram showing comparison of AC characteristic simulation results of the three structures is as shown in FIG. 7. The solid line represents the simulation result of the AC characteristic of the present invention, the broken line represents the simulation result of the AC characteristic of the structure shown in FIG. 2, and the center line represents the simulation result of the AC characteristic of the structure shown in FIG. 1. It can be seen from FIG. 7 that in comparison with the traditional structures 1 and 2, since both the first-stage input transistors and the first-stage load transistors in the present invention adopt the self-biased cascode structures, the DC gain is increased remarkably. Meanwhile, since one left half plane zero is generated by the adopted compensation mode, the unity-gain bandwidth is increased obviously. Moreover, a larger phase margin can be acquired. In other words, the compensation capacitor $C_c$ required by the present invention has a smaller area under the condition of acquiring the same unity-gain bandwidth. Thus, more area is saved.

In the meantime, comparison results of basic parameters of the three structures are as shown in Table 1. Seen from the simulation result of Table 1, with respect to the two traditional structures, the low self-biased transconductance amplifier structure provided in the present invention has the advantages that under the condition of the same power consumption, the DC gain is at least increased by 26%, the unity-gain bandwidth is at least increased by 140%, and the FOM (Figure of Merit) is at least increased by 210%.

TABLE 1

| Parameter | Structure 1 | Structure 2 | Present invention |
|---|---|---|---|
| Power supply (V) | 1.8 | 1.8 | 1.8 |
| Technology (μm) | 0.18 | 0.18 | 0.18 |

TABLE 1-continued

| Parameter | Structure 1 | Structure 2 | Present invention |
|---|---|---|---|
| Capacitive load (pF) | 15 | 15 | 15 |
| Unity-gain bandwidth (MHz) | 56 | 60 | 146 |
| Phase margin (°) | 60 | 63 | 71 |
| DC gain (dB) | 71 | 76 | 96 |
| Power consumption (μW) | 720 | 720 | 720 |
| FOM (dB · MHz/μW) | 5.5 | 6.3 | 19.5 |

As a preferred embodiment, the compensation capacitor $C_c$ has the capacitance of 2 pF to 4 pF. Thus, a relatively excellent compensation effect can be achieved without occupying an excessively large area of a chip.

Figure 8:
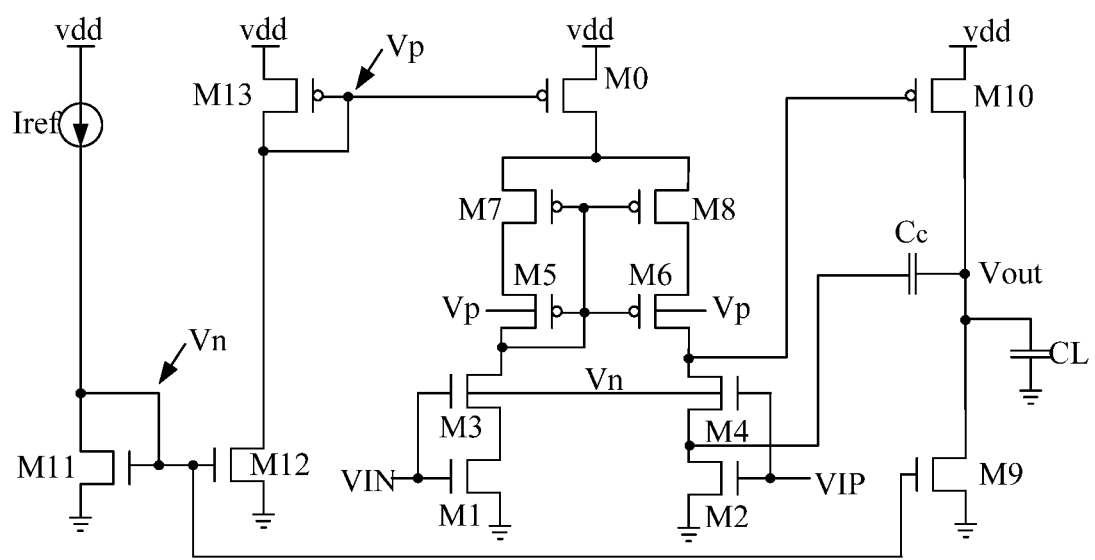
FIG. 8 is a schematic diagram of another transconductance amplifier based on a self-biased cascode structure according to the present invention.

The structure shown in FIG. 4 takes the PMOS transistors as the input transistors. Similarly, NMOS transistors may also serve as the input transistors with respect to all analysis of the present invention, of which a schematic diagram is as shown in FIG. 8. Accordingly, further provided in the present invention is a transconductance amplifier based on a self-biased cascode structure, which takes NMOS transistors as input transistors. The provided transconductance amplifier includes a self-biased cascode input-stage structure constituted by NMOS input transistors M1, M2, M3 and M4, a self-biased cascode first-stage load structure constituted by PMOS transistors M5, M6, M7 and M8, a second-stage common-source amplifier structure constituted by an NMOS transistor M9 and a PMOS transistor M10, a bias circuit structure constituted by NMOS transistors M11 and M12 and a PMOS transistor M13, an amplifier compensation capacitor $C_c$, an amplifier load capacitor $C_L$, a reference current source Iref and a PMOS transistor M0 that provides a constant current source function.

Sources of the NMOS input transistors M1 and M2 are grounded. Gates of the NMOS input transistors M1 and M3 are connected to an input signal VIN. Gates of the NMOS input transistors M2 and M4 are connected to an input signal VIP. A drain of the NMOS input transistor M1 is connected to a source of the NMOS input transistor M3. A drain of the NMOS input transistor M2 is connected to a source of the NMOS input transistor M4. Substrates of the NMOS input transistors M3 and M4 are connected to a bias voltage Vn. The bias voltage Vn is provided by a gate voltage of the NMOS transistor M11 of which a gate and a drain are connected in an amplifier bias circuit.

A gate and a drain of the PMOS transistor M5 are both connected to gates of the PMOS transistors M6, M7 and M8 and a drain of the NMOS input transistor M3. A drain of the PMOS transistor M6 is connected to a drain of the NMOS input transistor M4. A source of the PMOS transistor M5 is connected to a drain of the PMOS transistor M7. A source of the PMOS transistor M6 is connected to a drain of the PMOS transistor M8. Sources of the PMOS transistors M7 and M8 are connected to a drain of the PMOS transistor M0. Substrates of the PMOS transistors M5 and M6 are connected to a bias voltage Vp. The bias voltage Vp is provided by a gate voltage of the PMOS transistor M13 of which a gate and a drain are connected in the amplifier bias circuit.

A source of the PMOS transistor M10 is connected to a supply voltage vdd. A drain of the PMOS transistor M10, one end of the compensation capacitor $C_c$, a drain of the NMOS transistor M9 and one end of the load capacitor $C_L$ are connected to form a connection node. The connection node is an output Vout of the transconductance amplifier. A gate of the PMOS transistor M10 is connected to a drain of the NMOS input transistor M4. The other end of the compensation capacitor $C_c$ is connected to a drain of the PMOS input transistor M2. The other end of the load capacitor $C_L$ and a source of the NMOS transistor M9 are grounded. A gate of the NMOS transistor M9 is connected to a gate of the NMOS input transistor M12.

Sources of the PMOS transistors M0 and M13 are connected to the supply voltage vdd. A gate of the PMOS transistor M0 is connected to a gate and a drain of the PMOS transistor M13. A drain of the PMOS transistor M13 is connected to a drain of the NMOS transistor M12. A gate of the NMOS transistor M12 is connected to one end of the reference current source Iref and a gate and a drain of the NMOS transistor M11. Sources of the NMOS transistors M11 and M12 are grounded. The other end of the reference current source Iref is connected to the supply voltage vdd.

As a specific embodiment, except that the structure shown in FIG. 8 adopts the NMOS transistors as the input transistors, its corresponding circuit analysis is similar to that of the structure shown in FIG. 4, and therefore, will not be repeated herein. Similarly, as a specific implementation mode that the channel lengths of the NMOS input transistors M1 and M3 connected in series and the PMOS transistors M5 and M7 connected in series in FIG. 8 are reasonably distributed, a ratio of the channel length of the NMOS input transistor M1 to the channel length of the NMOS input transistor M3 is 1:4, and a ratio of the channel length of the NMOS transistor M5 to the channel length of the NMOS transistor M7 is 1:4. As a preferred embodiment, the compensation capacitor Cc has the capacitance of 2 pF to 4 pF. Thus, a relatively excellent compensation effect can be achieved without occupying an excessively large area of a chip.

The above descriptions are merely implementation modes of the present invention, and are not intended to limit the scope of the present invention. Equivalent structures made on the basis of the Description and the drawings of the present invention and directly or indirectly applied to other related technical fields should fall within the protection scope of the present invention in a similar way.

What is claimed is:

1. A transconductance amplifier based on a self-biased cascode structure, comprising a self-biased cascode input-stage structure constituted by PMOS (P-channel Metal Oxide Semiconductor) input transistors M1, M2, M3 and M4, a self-biased cascode first-stage load structure constituted by NMOS (N-channel Metal Oxide Semiconductor) transistors M5, M6, M7 and M8, a second-stage common-source amplifier structure constituted by an NMOS transistor M9 and a PMOS transistor M10, a bias circuit structure constituted by NMOS transistors M11 and M12 and a PMOS transistor M13, an amplifier compensation capacitor $C_c$, an amplifier load capacitor $C_L$, a reference current source Iref and a PMOS transistor M0 that provides a constant current source function, wherein:

sources of the PMOS input transistors M1 and M2 are connected to a drain of the PMOS transistor M0; gates of the PMOS input transistors M1 and M3 are connected to an input signal VIN; gates of the PMOS input transistors M2 and M4 are connected to an input signal VIP; a drain of the PMOS input transistor M1 is connected to a source of the PMOS input transistor M3; a drain of the PMOS input transistor M2 is connected to a source of the PMOS input transistor M4; substrates of the PMOS input transistors M3 and M4 are connected to a bias voltage Vp; and the bias voltage Vp is provided by a gate voltage of the PMOS transistor M13 of which a gate and a drain are connected in an amplifier bias circuit;

a gate and a drain of the NMOS transistor M5 are both connected to gates of the NMOS transistors M6, M7 and M8 and a drain of the PMOS input transistor M3; a drain of the NMOS transistor M6 is connected to a drain of the PMOS input transistor M4; a source of the NMOS transistor M5 is connected to a drain of the NMOS transistor M7; a source of the NMOS transistor M6 is connected to a drain of the NMOS transistor M8; sources of the NMOS transistors M7 and M8 are grounded; substrates of the NMOS transistors M5 and M6 are connected to a bias voltage Vn; and the bias voltage Vn is provided by a gate voltage of the NMOS transistor M11 of which a gate and a drain are connected in the amplifier bias circuit;

sources of the PMOS transistors M10, M0 and M13 are connected to a supply voltage vdd; a gate of the PMOS transistor M10 is connected to gates of the PMOS transistors M0 and M13; a drain of the PMOS transistor M10, one end of the compensation capacitor $C_c$, a drain of the NMOS transistor M9 and one end of the load capacitor $C_L$ are connected to form a connection node; the connection node is an output end Vout of the transconductance amplifier; the other end of the compensation capacitor $C_c$ is connected to a drain of the PMOS input transistor M2; the other end of the load capacitor $C_L$ and a source of the NMOS transistor M9 are grounded; and a gate of the NMOS transistor M9 is connected to a drain of the PMOS input transistor M4;

a drain of the PMOS transistor M13 is connected to a drain of the NMOS transistor M12; a gate of the NMOS transistor M12 is connected to one end of the reference current source Iref and a gate and a drain of the NMOS transistor M11; sources of the NMOS transistors M11 and M12 are grounded; and the other end of the reference current source Iref is connected to the supply voltage vdd.

2. The transconductance amplifier based on the self-biased cascode structure according to claim 1, wherein a ratio of a channel length of the PMOS input transistor M1 to a channel length of the PMOS input transistor M3 is 1:4, and a ratio of a channel length of the NMOS transistor M5 to a channel length of the NMOS M7 is 1:4.

3. The transconductance amplifier based on the self-biased cascode structure according to claim 1, wherein the compensation capacitor $C_c$ has the capacitance of 2 pF to 4 pF.

4. A transconductance amplifier based on a self-biased cascode structure, comprising a self-biased cascode input-stage structure constituted by NMOS input transistors M1, M2, M3 and M4, a self-biased cascode first-stage load structure constituted by PMOS transistors M5, M6, M7 and M8, a second-stage common-source amplifier structure constituted by an NMOS transistor M9 and a PMOS transistor M10, a bias circuit structure constituted by NMOS transistors M11 and M12 and a PMOS transistor M13, an amplifier compensation capacitor $C_c$, an amplifier load capacitor $C_L$, a reference current source Iref and a PMOS transistor M0 that provides a constant current source function, wherein:

sources of the NMOS input transistors M1 and M2 are grounded; gates of the NMOS input transistors M1 and M3 are connected to an input signal VIN; gates of the NMOS input transistors M2 and M4 are connected to an input signal VIP; a drain of the NMOS input transistor M1 is connected to a source of the NMOS input transistor M3; a drain of the NMOS input transistor M2 is connected to a source of the NMOS input transistor M4; substrates of the NMOS input transistors M3 and M4 are connected to a bias voltage Vn; and the bias voltage Vn is provided by a gate voltage of the NMOS transistor M11 of which a gate and a drain are connected in an amplifier bias circuit;

a gate and a drain of the PMOS transistor M5 are both connected to gates of the PMOS transistors M6, M7 and M8 and a drain of the NMOS input transistor M3; a drain of the PMOS transistor M6 is connected to a drain of the NMOS input transistor M4; a source of the PMOS transistor M5 is connected to a drain of the PMOS transistor M7; a source of the PMOS transistor M6 is connected to a drain of the PMOS transistor M8; sources of the PMOS transistors M7 and M8 are connected to a drain of the PMOS transistor M0; substrates of the PMOS transistors M5 and M6 are connected to a bias voltage Vp; and the bias voltage Vp is provided by a gate voltage of the PMOS transistor M13 of which a gate and a drain are connected in the amplifier bias circuit;

a source of the PMOS transistor M10 is connected to a supply voltage vdd; a drain of the PMOS transistor M10, one end of the compensation capacitor $C_c$, a drain of the NMOS transistor M9 and one end of the load capacitor $C_L$ are connected to form a connection node; the connection node is an output end Vout of the transconductance amplifier; a gate of the PMOS transistor M10 is connected to a drain of the NMOS input transistor M4; the other end of the compensation capacitor $C_c$ is connected to a drain of the PMOS input transistor M2; the other end of the load capacitor $C_L$ and a source of the NMOS transistor M9 are grounded; and a gate of the NMOS transistor M9 is connected to a gate of the NMOS transistor M12; and sources of the PMOS transistors M0 and M13 are connected to the supply voltage vdd; a gate of the PMOS transistor M0 is connected to a gate and a drain of the PMOS transistor M13; a drain of the PMOS transistor M13 is connected to a drain of the NMOS transistor M12; a gate of the NMOS transistor M12 is connected to one end of the reference current source Iref and a gate and a drain of the NMOS transistor M11; sources of the NMOS transistors M11 and M12 are grounded; and the other end of the reference current source Iref is connected to the supply voltage vdd.

5. The transconductance amplifier based on the self-biased cascode structure according to claim 4, wherein a ratio of a channel length of the NMOS input transistor M1 to a channel length of the NMOS input transistor M3 is 1:4, and a ratio of a channel length of the PMOS transistor M5 to a channel length of the PMOS M7 is 1:4.

6. The transconductance amplifier based on the self-biased cascode structure according to claim 4, wherein the compensation capacitor $C_c$ has the capacitance of 2 pF to 4 pF.

* * * * *